United States Patent
Shapira et al.

(10) Patent No.: US 9,239,756 B2
(45) Date of Patent: Jan. 19, 2016

(54) SYSTEMS AND METHODS FOR PERFORMING DATA RECOVERY IN A MEMORY SYSTEM

(71) Applicant: SanDisk Technologies Inc., Plano, TX (US)

(72) Inventors: Ofer Shapira, Herzliya (IL); Eran Sharon, Rishon Lezion (IL); Idan Alord, Herzliya (IL); Opher Lieber, Kfar Saba (IL)

(73) Assignee: SanDisk Technologies Inc., Plano, TX (US)

( * ) Notice: Subject to any disclaimer, the term of this patent is extended or adjusted under 35 U.S.C. 154(b) by 181 days.

(21) Appl. No.: 14/105,953

(22) Filed: Dec. 13, 2013

(65) Prior Publication Data

US 2015/0169420 A1 Jun. 18, 2015

(51) Int. Cl.
*G06F 11/00* (2006.01)
*G06F 11/10* (2006.01)
*G06F 12/10* (2006.01)
*G06F 12/08* (2006.01)
*G11C 29/52* (2006.01)

(52) U.S. Cl.
CPC .......... *G06F 11/1068* (2013.01); *G06F 11/106* (2013.01); *G06F 11/1008* (2013.01); *G06F 11/1044* (2013.01); *G06F 11/1048* (2013.01); *G06F 12/0891* (2013.01); *G06F 12/1045* (2013.01); *G11C 29/52* (2013.01)

(58) Field of Classification Search
CPC ............ G06F 11/1068; G06F 11/1008; G06F 11/1048; G06F 11/108; G06F 11/1044; G06F 11/1016; G06F 11/1004; G06F 11/1012
See application file for complete search history.

(56) References Cited

U.S. PATENT DOCUMENTS

| 2002/0126528 A1* | 9/2002 | Conley et al. ............ 365/185.04 |
| 2003/0101405 A1* | 5/2003 | Shibata .......................... 714/763 |
| 2008/0282025 A1* | 11/2008 | Biswas et al. ................. 711/103 |
| 2009/0158086 A1 | 6/2009 | Kwon |

FOREIGN PATENT DOCUMENTS

| EP | 1 912 121 A1 | 4/2008 |
| WO | WO 2012/075200 A2 | 6/2012 |
| WO | WO 2013/016393 A1 | 1/2013 |

* cited by examiner

*Primary Examiner* — Reginald Bragdon
*Assistant Examiner* — Thanh Vo
(74) *Attorney, Agent, or Firm* — Brinks Gilson & Lione

(57) ABSTRACT

Systems and methods for performing defect detection and data recovery within a memory system are disclosed. A controller of a memory system writes data to a physical location of a memory and stores the physical location of the memory in a Flash Management Unit Tag cache ("Tag cache"). The controller identifies a data keep cache that is associated with the physical location of memory and updates an XOR sum stored in the identified data keep cache. The controller determines whether to perform a verification operation, and in response to a determination to perform the verification operation, verifies data stored at each physical location that has been stored in the Tag cache since a previous verification operation. Additionally, the controller determines whether to perform a reset operation, and in response to a determination to perform the reset operation, flushes the Tag cache and the plurality of data keep caches.

15 Claims, 9 Drawing Sheets

SYSTEMS AND METHODS FOR PERFORMING DATA RECOVERY IN A MEMORY SYSTEM

The present application is related to U.S. patent application Ser. Nos. 13/795,460 and 13/795,470, filed Mar. 12, 2013, and the entirety of each of which are hereby incorporated by reference.

BACKGROUND

Traditionally, manufacturers test memory within memory systems at the time of manufacture in order to detect defects within the memory. One way in which manufacturers test memory for defects is to subject the memory to a number of operations in order to bring out defects in the memory. For example, causing significant stress in a memory may result in errors becoming evident such as a strong or weak control gate substrate short ("CGSS"), a wordline-to-wordline short, and/or a broken wordline within the memory of the storage system.

While the above-described procedure may allow manufacturers to detect defects within the memory, applying enough stress to the memory in order to bring out the defects may cause the memory to become vulnerable to more failures causing a loss of memory yield. Therefore, improved systems and methods for detecting defects within a memory that do not reduce an overall memory yield are desirable.

SUMMARY

The present disclosure is directed to systems and methods for performing data recovery in a memory system. In one aspect, a method is disclosed for performing data recovery in a memory system. The elements of the method occur in a controller of a memory system that is coupled to a host device. The controller writes data to a physical location of a memory of the memory system and stores the physical location of the memory in a Flash Management Tag cache ("Tag cache").

The controller identifies a data keep cache of a plurality of data keep caches that is associated with the physical location of the memory and updates an XOR sum stored in the identified data keep cache based on the data written to the physical location and the XOR sum that is stored in the identified data keep cache. The controller then stores the updated XOR sum in the identified data keep cache.

The controller determines whether to perform a verification operation based on a number of physical locations stored in the Tag cache since a previous verification operation. In response to a determination to perform the verification operation, the controller verifies data stored at each physical location of memory that has been stored in the Tag cache since the previous verification operation.

The controller determines whether to perform a reset operation to flush the Tag cache and data keep caches based on a number of physical locations of memory stored in the Tag cache. In response to a determination to perform the reset operation, the controller flushes the Tag cache and the plurality of data keep caches.

In another aspect, a memory system is disclosed. The memory system comprises a non-volatile memory and a processor in communication with the non-volatile memory. The processor is configured to perform data recovery in the memory system.

The processor is further configured to write data to a physical location of the non-volatile memory and store the physical location of the non-volatile memory in a Flash Management Tag cache ("Tag cache").

The processor is further configured to identify a data keep cache of a plurality of data keep caches that is associated with the physical location of the non-volatile memory and update an XOR sum stored in the identified data keep cache based on the data written to the physical location of memory and the XOR sum that is stored in the identified data keep cache. The controller is configured to store the updated XOR sum in the identified data keep cache.

The processor is further configured to determine whether to perform a verification operation based on a number of physical locations stored in the Tag cache since a previous verification operation. In response to a determination to perform the verification operation, the processor is configured to verify data stored at each physical location that has been stored in the Tag cache since the previous verification operation.

The processor is further configured to determine whether to perform a flush operation based on a number of physical locations stored in the Tag cache. In response to a determination to perform the flush operation, the processor is configured to flush the Tag cache and the plurality of data keep caches.

DETAILED DESCRIPTION OF THE DRAWINGS

The present disclosure is directed to systems and methods for performing defect detection and data recovery in a memory system. As explained in more detail below, a controller may utilize a system cache, such as a Flash Management Unit Tag cache ("Tag cache"), and a plurality of data keep caches to store information as the controller performs data write operations. The controller utilizes the Tag cache and the plurality of data keep caches to periodically perform a verification operation and ensure that data is stored correctly. When an error is detected, the controller may reconstruct and restore data to a physical location of the memory. Because the memory system utilizes techniques that are able to detect defects in a memory and perform error correction at a system level, manufactures may refrain from performing harsh testing on the memory system that may reduce the overall yield of the memory.

Figure 1:
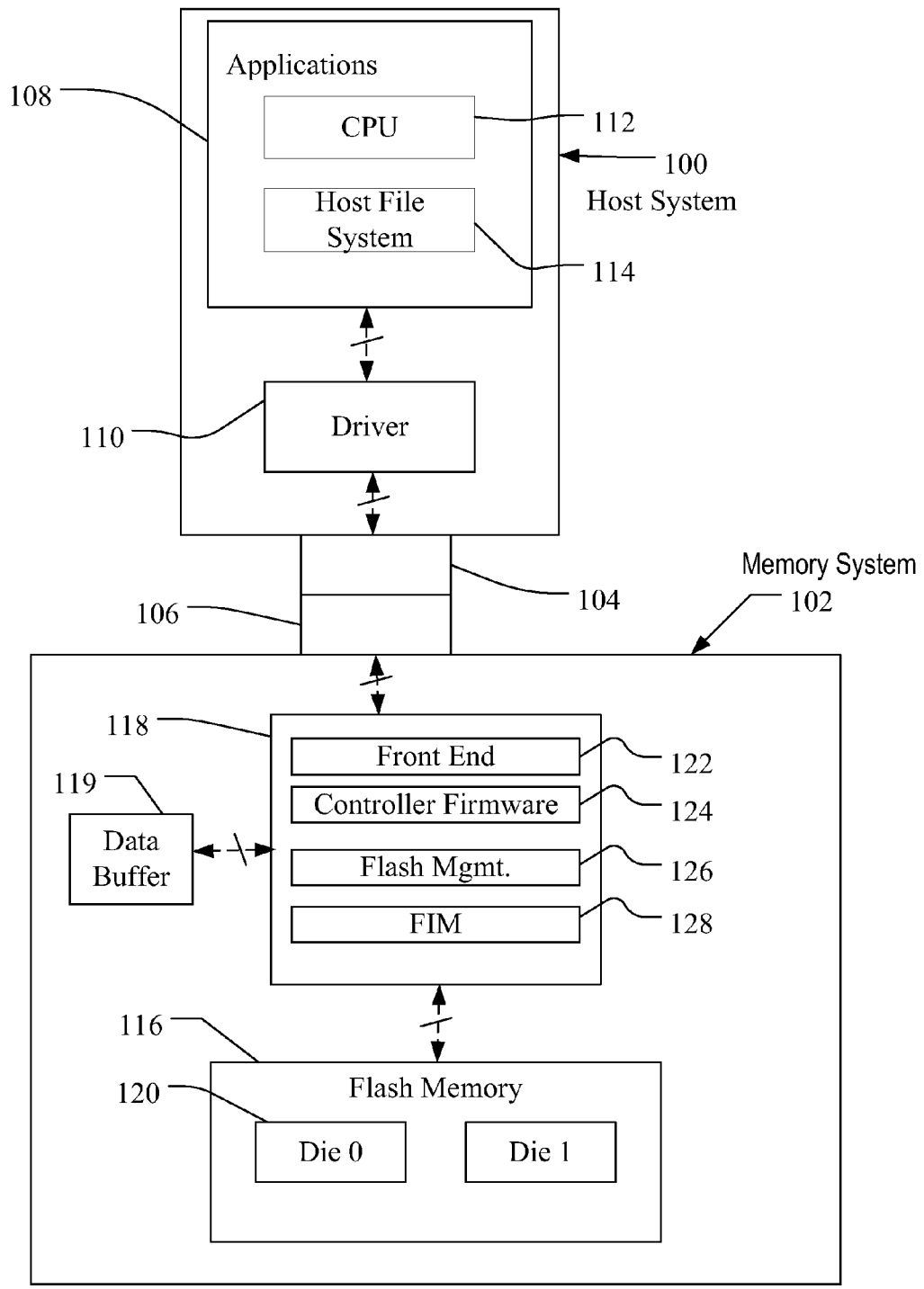
FIG. 1 illustrates a host connected with a memory system having a multi-bank non-volatile memory containing multiple die that may implement the disclosed methods for performing defect detection and data recovery.

A flash memory system suitable for use in implementing aspects of the invention is shown in FIGS. 1-6. A host system 100 of FIG. 1 stores data into and retrieves data from a memory system 102. The memory system may be flash memory embedded within the host, such as in the form of a solid state disk (SSD) drive installed in a personal computer. Alternatively, the memory system 102 may be in the form of a card that is removably connected to the host through mating parts 104 and 106 of a mechanical and electrical connector as illustrated in FIG. 1. A flash memory configured for use as an internal or embedded SSD drive may look similar to the schematic of FIG. 1, with the primary difference being the location of the memory system 102 internal to the host. SSD drives may be in the form of discrete modules that are drop-in replacements for rotating magnetic disk drives.

The host system 100 of FIG. 1 may be viewed as having two major parts, in so far as the memory system 102 is concerned, made up of a combination of circuitry and software. They are an applications portion 108 and a driver portion 110 that interface with the memory system 102. In a PC, for example, the applications portion 108 can include a processor 112 running word processing, graphics, control or other popular application software, as well as the file system 114 for managing data on the host 100. In a camera, cellular telephone or other host system that is primarily dedicated to perform a single set of functions, the applications portion 108 includes the software that operates the camera to take and store pictures, the cellular telephone to make and receive calls, and the like.

The memory system 102 of FIG. 1 may include non-volatile memory, such as flash memory 116; a system controller 118 that both interfaces with the host 100 to which the memory system 102 is connected for passing data back and forth and controls the memory 116; and one or more data buffers 119 coupled with the system controller 118 that the system controller 118 utilizes to buffer data before storing the data to the flash memory 116. The system controller 118 may convert between logical addresses of data used by the host 100 and physical addresses of the flash memory 116 during data programming and reading. The flash memory 116 may include any number of memory die 120 and two memory die are shown in FIG. 1 simply by way of illustration.

Functionally, the system controller 118 may include a front end 122 that interfaces with the host system, controller logic 124 for coordinating operation of the memory 116, flash management logic 126 for internal memory management operations such as garbage collection, and one or more flash interface modules (FIMs) 128 to provide a communication interface between the controller with the flash memory 116.

Figure 2:
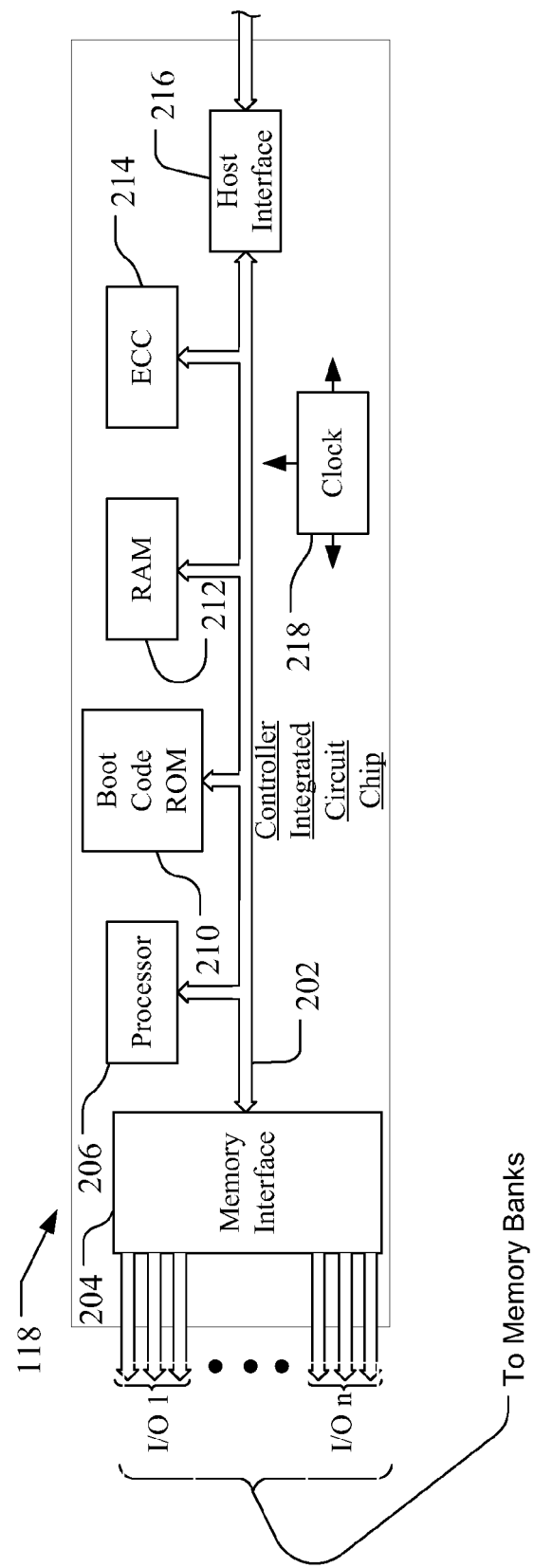
FIG. 2 is an example block diagram of an example flash memory system controller for use in the multiple die non-volatile memory of FIG. 1.

The system controller 118 may be implemented on a single integrated circuit chip, such as an application specific integrated circuit (ASIC) such as shown in FIG. 2. The processor 206 of the system controller 118 may be configured as a multi-thread processor capable of communicating separately with each of the respective memory banks 120 via a memory interface 204 having I/O ports for each of the respective banks 120 in the flash memory 116. The system controller 118 may include an internal clock 218. The processor 206 communicates with an error correction code (ECC) module 214, a RAM buffer 212, a host interface 216, and boot code ROM 210 via an internal data bus 202.

Figure 3:
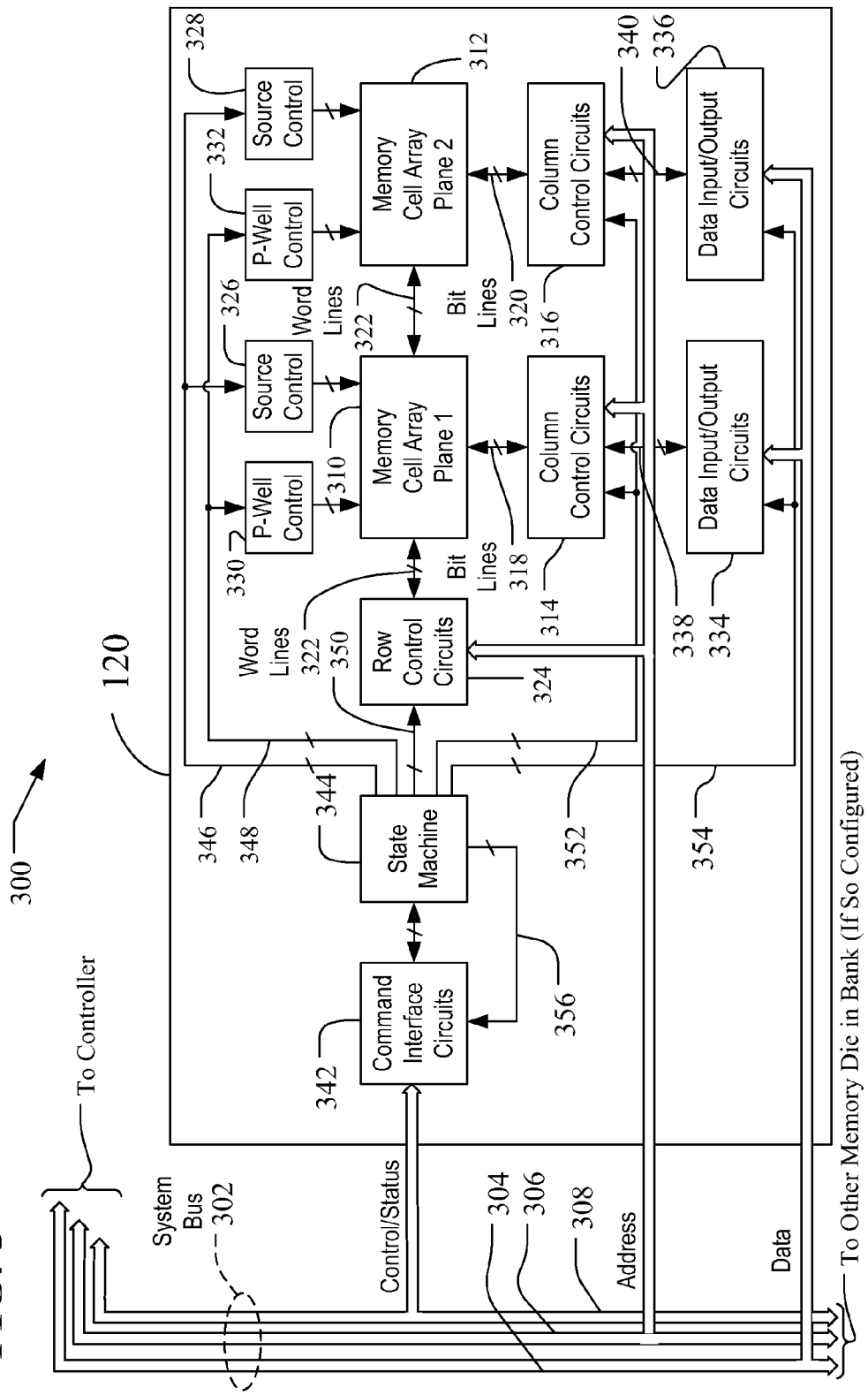
FIG. 3 is an example flash memory bank suitable as one of the non-volatile memory banks illustrated in FIG. 1.

Each die 120 in the flash memory 116 may contain an array of memory cells organized into multiple planes. FIG. 3 shows such planes 310 and 312 for simplicity but a greater number of planes, such as four or eight planes, may instead be used. Alternatively, the memory cell array of a memory bank may not be divided into planes. When so divided, however, each plane has its own column control circuits 314 and 316 that are operable independently of each other. The circuits 314 and 316 receive addresses of their respective memory cell array from the address portion 306 of the system bus 302, and decode them to address a specific one or more of respective bit lines 318 and 320. The word lines 322 are addressed through row control circuits 324 in response to addresses received on the address bus 306. Source voltage control circuits 326 and 328 are also connected with the respective planes, as are p-well voltage control circuits 330 and 332. If the bank 300 is in the form of a memory chip with a single array of memory cells, and if two or more such chips exist in the system, data are transferred into and out of the planes 310 and 312 through respective data input/output circuits 334 and 336 that are connected with the data portion 304 of the system bus 302. The circuits 334 and 336 provide for both programming data into the memory cells and for reading data from the memory cells of their respective planes, through lines 338 and 340 connected to the planes through respective column control circuits 314 and 316.

Although the processor 206 in the system controller 118 controls the operation of the memory chips in each bank 120 to program data, read data, erase and attend to various housekeeping matters, each memory chip also contains some controlling circuitry that executes commands from the controller 118 to perform such functions. Interface circuits 342 are connected to the control and status portion 308 of the system bus 302. Commands from the controller 118 are provided to a state machine 344 that then provides specific control of other circuits in order to execute these commands. Control lines 346-354 connect the state machine 344 with these other circuits as shown in FIG. 3. Status information from the state machine 344 is communicated over lines 356 to the interface 342 for transmission to the controller 118 over the bus portion 308.

A NAND architecture of the memory cell arrays 310 and 312 is discussed below, although other architectures, such as NOR, can be used instead. An example NAND array is illustrated by the circuit diagram of FIG. 4, which is a portion of the memory cell array 310 of the memory bank 300 of FIG. 3. A large number of global bit lines are provided, only four such lines 402-408 being shown in FIG. 4a for simplicity of explanation. A number of series connected memory cell strings 410-424 are connected between one of these bit lines and a reference potential. Using the memory cell string 414 as representative, a plurality of charge storage memory cells 426-432 are connected in series with select transistors 434 and 436 at either end of the string. When the select transistors of a string are rendered conductive, the string is connected between its bit line and the reference potential. One memory cell within that string is then programmed or read at a time.

Figure 4A:
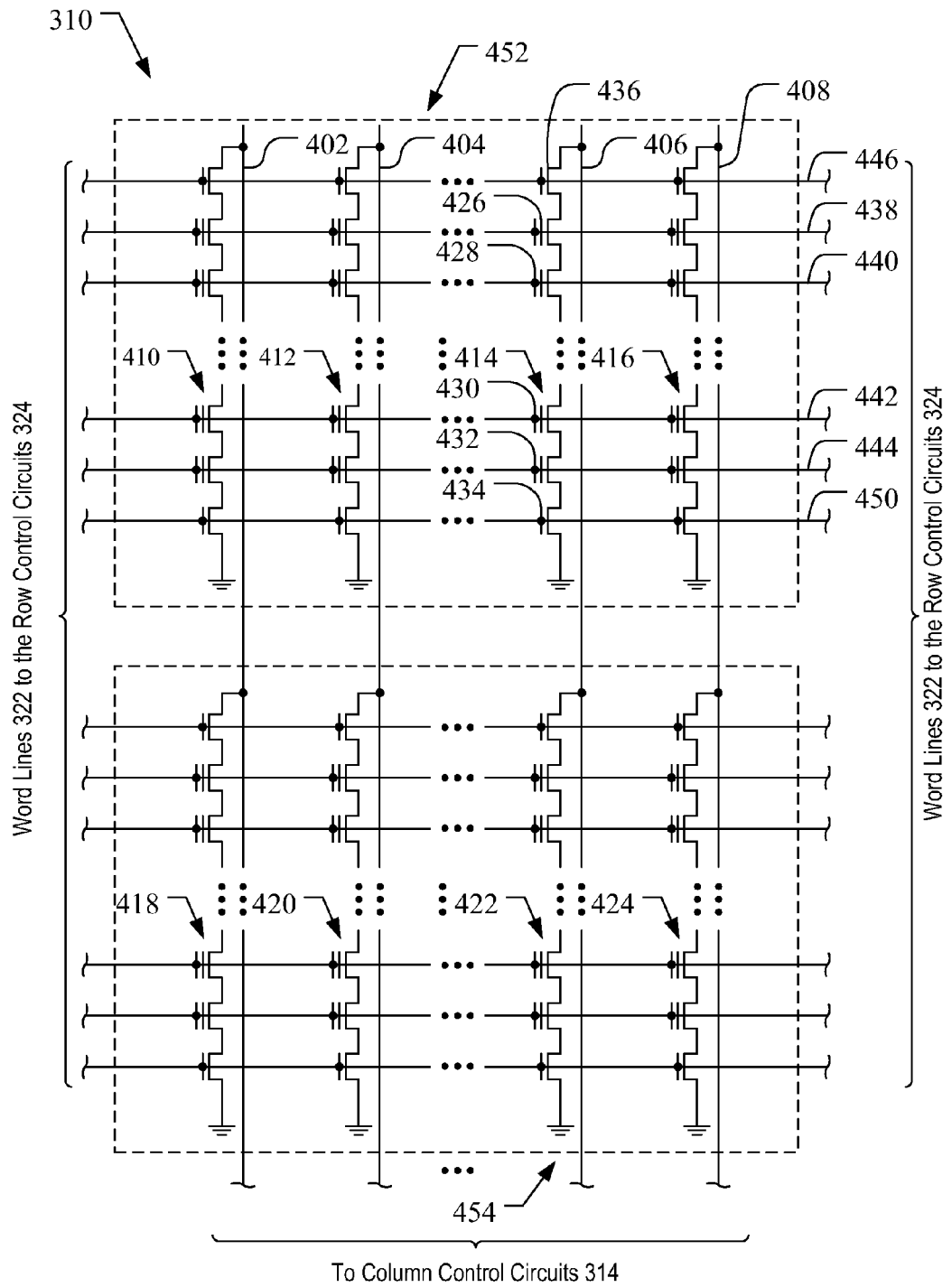
FIG. 4a is a representative circuit diagram of a memory cell array that may be used in the memory bank of FIG. 3.

Word lines 438-444 of FIG. 4a individually extend across the charge storage element of one memory cell in each of a number of strings of memory cells, and gates 446 and 450 control the states of the select transistors at each end of the strings. The memory cell strings that share common word and control gate lines 438-450 are made to form a block 452 of memory cells that are erased together. This block of cells contains the minimum number of cells that are physically erasable at one time. One row of memory cells, those along one of the word lines 438-444, are programmed at a time. Typically, the rows of a NAND array are programmed in a prescribed order, in this case beginning with the row along the word line 444 closest to the end of the strings connected to ground or another common potential. The row of memory cells along the word line 442 is programmed next, and so on, throughout the block 452. However, in other implementations, the rows of a NAND array are not programmed in sequential order.

A second block 454 is similar, its strings of memory cells being connected to the same global bit lines as the strings in the first block 452 but having a different set of word and control gate lines. The word and control gate lines are driven to their proper operating voltages by the row control circuits 324. If there is more than one plane in the system, such as planes 1 and 2 of FIG. 3, one memory architecture uses common word lines extending between them. There can alternatively be more than two planes that share common word lines. In other memory architectures, the word lines of individual planes are separately driven.

The memory cells may be operated to store two levels of charge so that a single bit of data is stored in each cell. This is typically referred to as a binary or single level cell (SLC) memory. Alternatively, the memory cells may be operated to store more than two detectable levels of charge in each charge storage element or region, thereby to store more than one bit of data in each. This latter configuration is referred to as multi level cell (MLC) memory. Both types of memory cells may be used in a memory. For example, binary flash memory may be used for caching data and MLC memory may be used for longer term storage. The charge storage elements of the memory cells are most commonly conductive floating gates but may alternatively be non-conductive dielectric charge trapping material.

In implementations of MLC memory operated to store two bits of data in each memory cell, each memory cell is configured to store four levels of charge corresponding to values of "11," "01," "10," and "00." Each bit of the two bits of data may represent a page bit of a lower page or a page bit of an upper page, where the lower page and upper page span across a series of memory cells sharing a common word line. Typically, the less significant bit of the two bits of data represents a page bit of a lower page and the more significant bit of the two bits of data represents a page bit of an upper page.

Figure 4B:
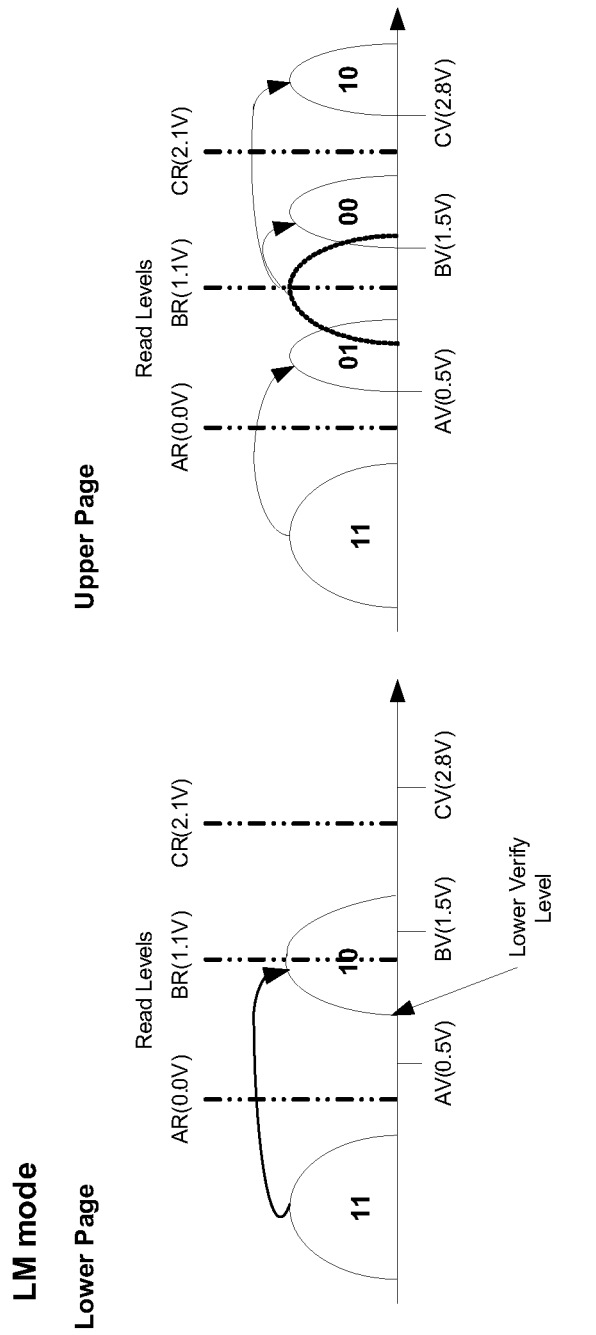
FIG. 4b illustrates charge levels in a MLC memory operated to store two bits of data in a memory cell.

FIG. 4b illustrates one implementation of the four charge levels used to represent two bits of data in a memory cell. A value of "11" corresponds to an un-programmed state of the memory cell. When programming pulses are applied to the memory cell to program a page bit of the lower page, the level of charge is increased to represent a value of "10" corresponding to a programmed state of the page bit of the lower page.

For a page bit of an upper page, when the page bit of the lower page is programmed (a value of "10"), programming pulses are applied to the memory cell for the page bit of the upper page to increase the level of charge to correspond to a value of "00" or "10" depending on the desired value of the page bit of the upper page. However, if the page bit of the lower page is not programmed such that the memory cell is in an un-programmed state (a value of "11"), applying programming pulses to the memory cell to program the page bit of the upper page increases the level of charge to represent a value of "01" corresponding to a programmed state of the page bit of the upper page.

Figure 5:
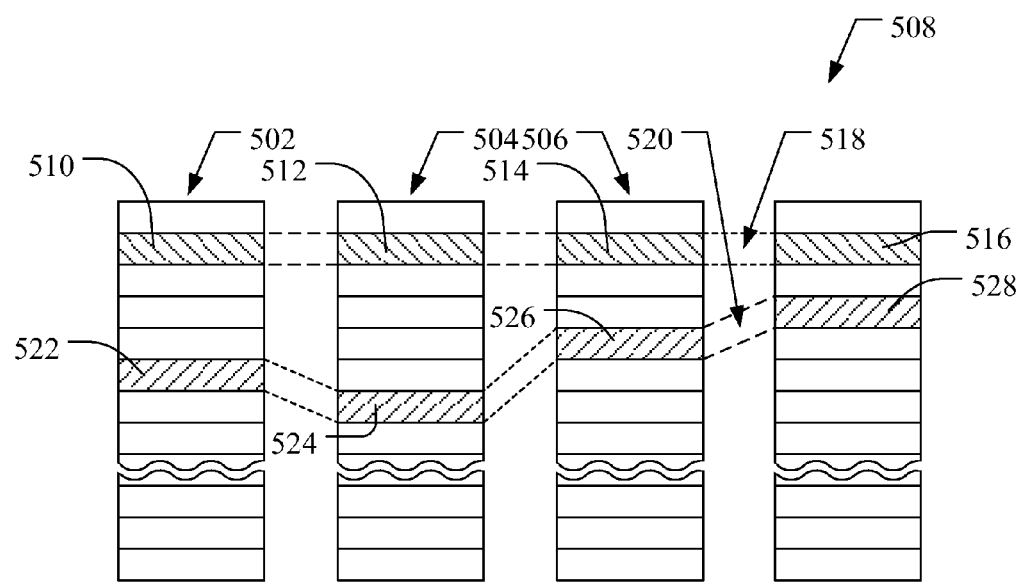
FIG. 5 illustrates an example physical memory organization of the memory bank of FIG. 3.

FIG. 5 conceptually illustrates a multiple plane arrangement showing four planes 502-508 of memory cells. These planes 502-508 may be on a single die, on two die (two of the planes on each die) or on four separate die. Of course, other numbers of planes, such as 1, 2, 8, 16 or more may exist in each die of a system. The planes are individually divided into blocks of memory cells shown in FIG. 5 by rectangles, such as blocks 510, 512, 514 and 516, located in respective planes 502-508. There can be dozens or hundreds of blocks in each plane.

As mentioned above, a block of memory cells is the unit of erase, the smallest number of memory cells that are physically erasable together. For increased parallelism, however, the blocks are operated in larger metablock units. One block from each plane is logically linked together to form a metablock. The four blocks 510-516 are shown to form one metablock 518. All of the cells within a metablock are typically erased together. The blocks used to form a metablock need not be restricted to the same relative locations within their respective planes, as is shown in a second metablock 520 made up of blocks 522-528. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation.

Figure 6:
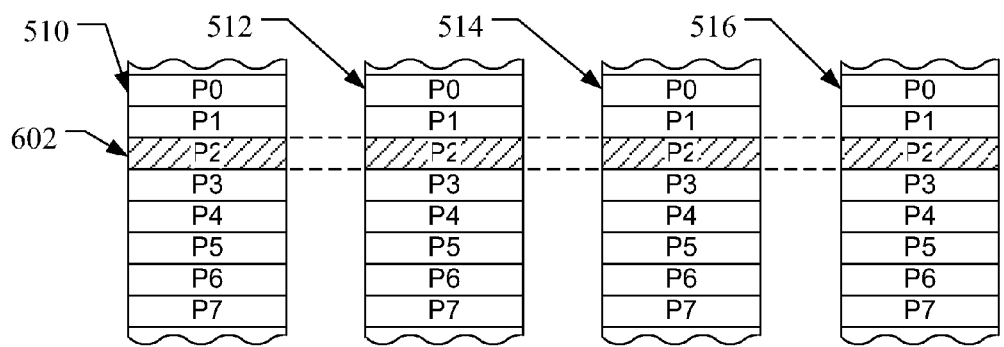
FIG. 6 shows an expanded view of a portion of the physical memory of FIG. 5.

The individual blocks are in turn divided for operational purposes into pages of memory cells, as illustrated in FIG. 6. The memory cells of each of the blocks 510-516, for example, are each divided into eight pages P0-P7. Alternatively, there may be 32, 64 or more pages of memory cells within each block. The page is the unit of data programming and reading within a block, containing the minimum amount of data that are programmed or read at one time. In the NAND architecture of FIG. 3, a page is formed of memory cells along a word line within a block. However, in order to increase the memory system operational parallelism, such pages within two or more blocks may be logically linked into metapages. A metapage 602 is illustrated in FIG. 6, being formed of one physical page from each of the four blocks 510-516. The metapage 602, for example, includes the page P2 in each of the four blocks but the pages of a metapage need not necessarily have the same relative position within each of the blocks.

The flash management layer in the controller firmware of the memory card may choose to allocate memory in terms of allocation units called logical groups. Writes that are less than a logical group size will result in the controller copying valid data stored at an original physical location to a new physical location in addition to the controller writing incoming data. This overhead decreases performance and endurance of the memory. In order to minimize this overhead, a group of memory is used as update blocks. An update block is usually a memory of better endurance than the data blocks. i.e, if the data blocks have MLC memory, the update blocks have SLC memory. Writes that are less than a logical group may result in the controller directing data into the update blocks, and after consolidation, the controller may copy data at a later point in time from the update block to one or more program data blocks. The controller performs these actions based on the fact that the update blocks are more durable and there is more possibility of collecting the entire logical group of data in the update blocks before writing into the data blocks, thus reducing overhead in the MLC memory. It is also more desirable to retain frequently written data blocks in the update block for similar reasons.

As mentioned above, this disclosed systems and methods provide for a controller of a memory system that performs data recovery at a system level. Generally, as the controller performs data writes to a non-volatile memory of the memory system, the controller records a physical location associated with the data writes in a Flash Management Unit Tag cache ("Tag cache"), which is typically part of the controller RAM.

In some implementations, the size of the Tag cache is static. In other implementations, a controller may dynamically adjust a size of the Tag cache based on a number of open data blocks in the memory system.

Based on the physical location associated with the data writes, the controller also assigns the data write to one of a plurality of data keep caches. The controller further updates an XOR sum stored in the identified data keep cache based on the data of the data write. The data keep caches are typically part of the controller RAM. In some implementations, the sizes of the data keep caches are static. In other implementations, a controller may dynamically adjust a size of one or more of the data keep caches based on a number of open data blocks in the memory system.

As will be discussed in more detail below, the controller maintains multiple XOR sums, each of which is stored in a different data keep cache and is associated with a different group of physical locations of the memory. The groups of physical locations of the memory associated with the multiple data keep caches are organized such that if one XOR sum is utilized to recalculate data for a first physical location of the memory, at least one of the other XOR sums may be utilized to recalculate and/or verify data for a second physical location of the memory that may have been disturbed by an error at the first physical location of the memory.

In some implementations, the memory system may include a first data keep cache associated with upper pages and even numbered word lines of a die of the memory system; a second data keep cache associated with upper pages and odd numbered word lines of the die of the memory system; a third data keep cache associated with lower pages and even numbered word lines of the die of the memory system; and a fourth data keep cache associated with lower pages and odd numbered word lines of the die of the memory system. However, in other implementations, the memory system may include other than four data keep caches.

Continuing with the example above, due to this organization, if a controller detects a failure such as an erratic program detection failure ("EPD failure") at a physical location of the memory associated with an upper page and an even numbered word line, the controller may utilize the Tag cache and the XOR sum of the first data keep to restore the data to the physical location where the failure was detected. Additionally, the controller may utilize the Tag cache and the XOR sum of the second data keep cache to verify physical locations of the memory associated with upper pages and odd numbered word lines that may have been disturbed by the originally-detected failure. The controller may further utilize the Tag cache and the XOR sum of the third data keep cache to verify physical locations of the memory associated with lower pages and even numbered word lines that may have been disturbed by the originally-detected failure, and the controller may utilize the Tag cache and the XOR sum of the fourth data keep cache to verify physical locations of the memory associated with lower pages and odd numbered word lines that may have been disturbed by the originally-detected failure.

As discussed in more detail below, the controller may utilize the Tag cache and the plurality of data keep caches to periodically perform verification operations and reset operations to identify and restore corrupted data. In some implementations, the controller may perform a verification operation periodically each time the controller stores a defined number of physical locations of memory in the Tag cache. Because the controller performs the verification operation each time the controller stores a defined number of physical location of memory in the Tag cache, the controller may only verify the data stored at the physical locations of memory that have been stored in the Tag cache since a previous verification operation.

It will be appreciated that if the controller determines during a verification operation that data stored at one or more of the physical locations stored in the Tag cache is corrupted, an amount of time to execute a recovery operation utilizing the plurality of data keep caches to recalculate the data for the corrupted data is proportional to the number of physical locations stored in the Tag cache. The greater the number of physical locations stored in the Tag cache, the more time it takes the controller to recalculate the data for the corrupted data.

In order to improve performance, the controller may balance how often to perform verification operations on data stored at the physical locations of memory stored in the Tag cache with how often to perform a reset operation to flush the Tag cache and the plurality of data keep caches. Storing a large number of physical locations of memory in the Tag cache provides protection to a larger amount of data, but with the disadvantages of: 1. slower recovery times due the large number of XOR operations that must be performed to recalculate data and 2. an increased risk of uncorrectable error since a controller may only utilize an XOR sum to correct one error. Alternatively, storing a small number of physical locations of memory in the Tag cache provides for fast recovery times when the controller recalculates data based on an XOR sum of a data keep cache, but at the cost of providing protection for fewer physical locations of memory.

In some implementations, the controller may set the number of physical locations of memory that the controller stores in the tag cache before the controller performs a reset operation to be greater than a number of physical locations of memory that the controller stores in the tag cache before the controller performs a verification operations. For example, the controller may set the number of physical locations of memory that the controller stores in the tag cache before the controller performs a reset operation to be approximately 150 time greater than a number of physical locations of memory that the controller stores in the tag cache before the controller performs a verification operation. Accordingly, in one example, the controller may perform a verification operation each time is stores four physical locations of memory in the tag cache and perform a reset operation each time the controller stores 600 physical locations of memory in the tag cache. Therefore, the controller will perform 150 verification operations for every reset operation.

In another example, the controller may set the number of physical locations of memory that the controller stores in the tag cache before the controller performs a reset operation to be at least three times greater than a number of physical locations of memory that the controller stores in the tag cache before the controller performs a verification operation. Accordingly, in one example, the controller may perform a verification operation each time it stores two physical locations of memory in the tag cache and perform a reset operation each time it stores six physical location so memory in the tag cache. Therefore, the controller will perform three verification operations for every reset operation.

Figure 7:
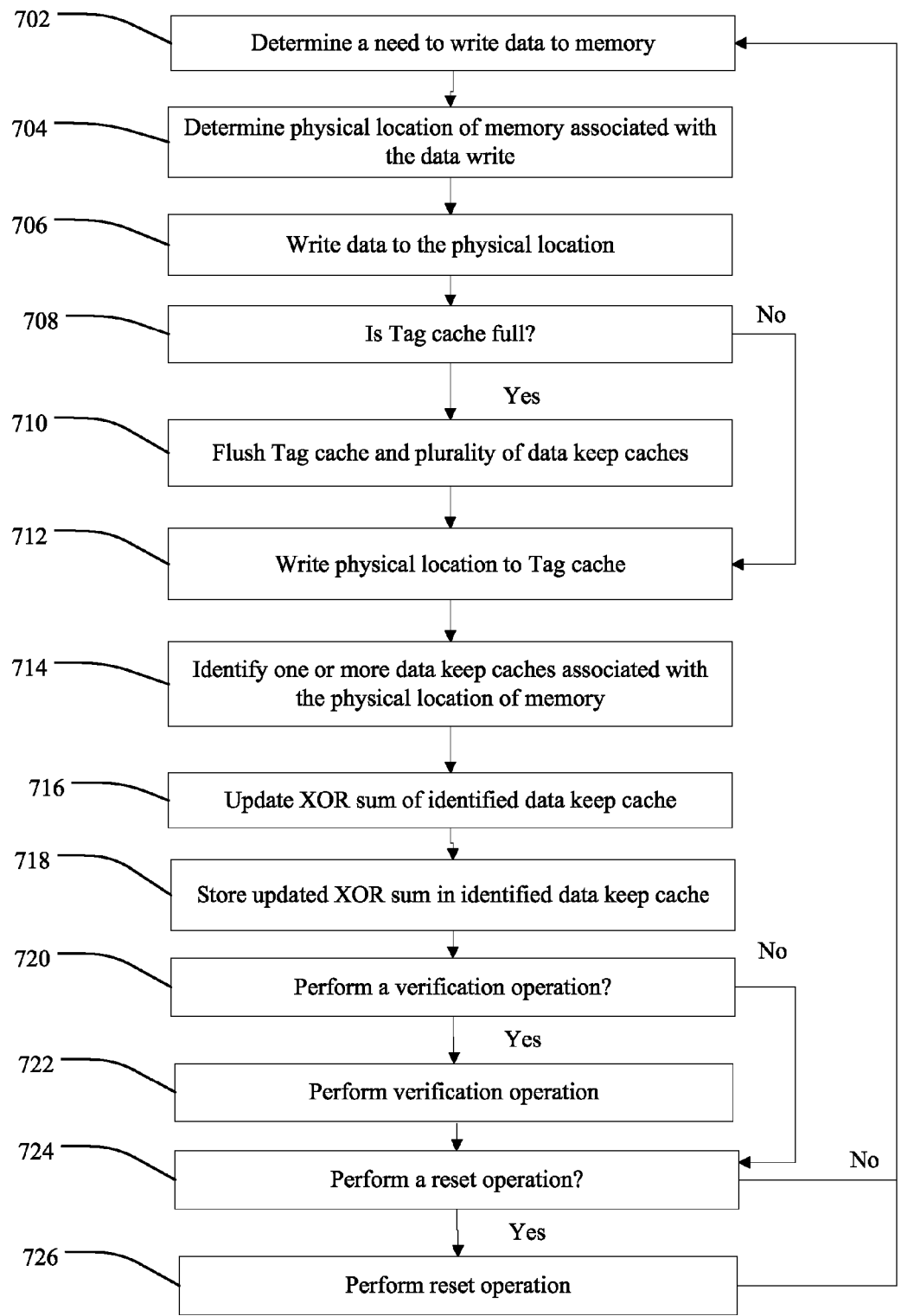
FIG. 7 is a flow chart of one method for storing information in a Tag cache and a plurality of data keep caches.

FIG. 7 is a flow chart of one method for processing data writes and storing information associated with data writes in a Tag cache and a plurality of data keep caches. In some implementations, the elements of the method described in FIG. 7 occur in a controller of a memory system that is coupled to a host device. However, in other implementations, the controller is located on the host device or the controller is divided between the memory system and the host device.

The method begins at step 702 with a controller determining a need to write data to a physical location of a non-volatile memory, such as flash memory, of a memory system. It will be appreciated that the controller may determine the need to write data to the physical location in response to receiving a data write command to write data to the memory from the host system or the controller may initiate a command to write data to the memory on its own.

At step 704, the controller determines a physical location of the memory that is associated with the data write. In some implementations, when the controller determines the physical location of the memory associated with the data write, the controller determines a die of the memory, a plane of the die, an upper or lower page, and/or a word line associated with the data write.

At step 706, the controller writes data associated with the data write to the physical location of the memory that the controller previously determined is associated with the data write.

As noted above, the controller utilizes the Tag cache to store physical locations of the memory that are associated with data writes. In implementations where the Tag cache is a normal cache, the controller may check to determine if the Tag cache is full at step 708 before storing the physical location associated with the data write to the Tag cache.

If the controller determines at step 708 that the Tag cache is not full, the controller proceeds to store the physical location associated with the data write in the Tag cache at step 712.

However, if the controller determines at step 708 that the Tag cache is full, the controller performs a reset operation to flush the Tag cache and the plurality of data keep caches at step 710 in order to empty the Tag cache and zero out the XOR sums stored in the data keep caches. One process for performing a reset operation to flush the Tag cache and the plurality of data keep caches is explained in more detail below in conjunction with FIG. 9. After the controller performs the reset operation to flush the Tag cache and the plurality of data keep caches, at step 712, the controller stores the physical location associated with the data write in the Tag cache.

At step 714, the controller identifies a data keep cache of a plurality of data keep caches that is associated with the data write based on the physical location of the memory that is associated with the data write. In some implementations, the controller may identify a data keep cache associated with the data write based on a word line and upper or lower page associated with the physical location that is associated with the data write, as described above.

At step 716, the controller updates an XOR sum stored in the identified data keep cache based on the data of the data write and the XOR sum that is stored in the identified data keep cache. At step 718, the controller stores the updated XOR sum in the identified data keep cache.

At step 720, the controller determines whether to perform a verification operation based on a number of physical locations stored in the Tag cache since a previous verification operation. In some implementations, the controller determines whether to perform a verification operation by comparing the number of physical locations stored in the Tag cache since a previous verification operation to a threshold.

When the controller determines that the number of physical locations stored in the Tag cache since a previous verification operation exceeds the threshold, at step 722, the controller performs a verification operation to verify the data stored at each physical location of memory stored in the Tag cache since a previous verification operation.

In some implementations, the controller verifies data stored at the physical locations of memory that have been stored in the Tag cache by recalculating an XOR sum for the plurality of data keep caches that are associated with the physical locations of memory stored in the Tag cache and comparing the recalculated XOR sum with the actual XOR sum stored in the appropriate data keep caches. If the XOR sums are the same, the controller determines that the data stored at the physical locations of memory stored in the Tag cache is valid and has not been corrupted.

However, if the XOR sums do not match, the controller determines that data stored at one or more of the physical locations of memory stored in the Tag cache is corrupted. In order to determine which of the one or more physical locations of memory stored in the Tag cache is corrupted, the controller may utilize tools such as error detection/correction parity specific to a page of memory to determine which of the one or more physical locations of memory stored in the Tag cache contains an error, as known to one of skill in the art. After detecting the error, the controller may utilize the XOR sums of the data keep caches to recalculate the data for the physical location of memory where the error occurred. One method for recalculating data for a physical location of memory based on XOR sums of data keep caches is described below in conjunction with FIG. 8.

Referring again to step 720, if the controller alternatively determines that the number of physical locations stored in the Tag cache since a previous verification operation does not exceed the threshold, the method proceeds to step 724.

At step 724, the controller determines whether to perform a reset operation to flush the Tag cache and the plurality of data keep caches based on a number of physical locations stored in the Tag cache. In some implementations, the controller determines whether to perform a reset operation by comparing the number of physical locations stored in the Tag cache to a threshold.

As discussed above, in some implementations, the threshold associated with determining when to perform a reset operation is greater than the threshold associated with determining when to perform a verification operation. For example, the controller may set the threshold associated with determining when to perform a reset operation to be at least 150 times as great as the threshold for determining when to perform a verification operation. This allows the controller to perform multiple verification operations before performing a reset operation.

When the controller determines at step 724 that the number of physical locations of memory stored in the Tag cache exceeds the threshold, at step 726, the controller performs a reset operation to flush the Tag cache and the plurality of data keep caches at step 710 in order to empty the Tag cache and zero out the XOR sums stored in the data keep caches. As mentioned above, one process for performing a reset operation to flush the Tag cache and the plurality of data keep caches is explained in more detail below in conjunction with FIG. 9. The method then loops to step 702 and the controller performs the above-described steps for future data writes.

Referring again to step 724, if the controller alternatively determines that the number of physical locations of memory stored in the Tag cache does not exceed the threshold, the method loops to step 702 and the controller performs the above-described steps for future data writes.

Figure 8:
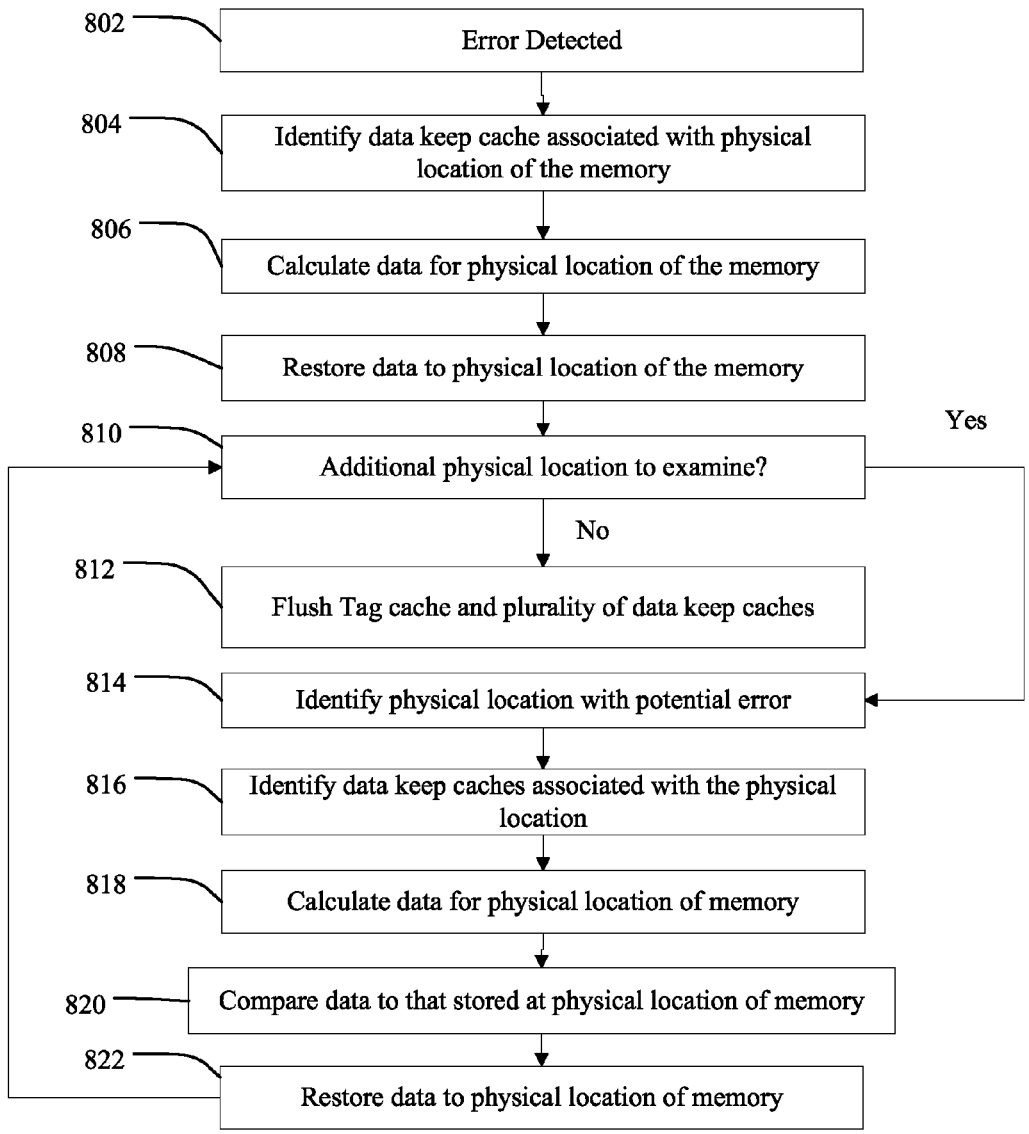
FIG. 8 is a flow chart of one method for performing data recovery after a controller detects a failure in the memory system.

FIG. 8 is a flow chart of one method for performing data recovery after a controller detects a failure in the memory system. The method begins at step 802 with the controller determining that data at a physical location of memory stored in a Tag cache is corrupt. As discussed above, the controller may determine that data stored at a physical location of memory is corrupt during a verification operation, for example.

At step 804, the controller identifies a data keep cache associated with the physical location of the memory. At step 806, the controller calculates the data associated with the physical location based on the XOR sum stored in the identified data keep cache that is associated with the physical location of the memory that is associated with the data write. In one implementation, the controller calculates the data associated with the physical location by beginning with the XOR sum and XORing the data of each physical location of the memory stored in the Tag cache that is also associated with the identified data keep cache other than the data that is determined to be corrupt.

At step 808, the controller restores the data based on the calculations at step 806. In some implementations, to restore the data, the controller stores the recalculated data to the same physical location of memory where the detected corruption occurred. However, in other implementations, the controller may store the recalculated data to a physical location of memory other then that physical location of memory where the error occurred.

At step 810, the controller determines whether any additional physical locations of the memory should be examined based on the physical location of the memory where the originally detected failure occurred. Those of skill in the art will appreciate that a failure at a physical location of the memory may disturb other physical locations of the memory when the two physical locations of memory share a wordline or the two physical location of memory share adjacent wordlines, for example.

If the controller determines at step 810 that no additional locations of memory should be examined, at step 812, the controller flushes the Tag cache and the plurality of data keep caches. One process for flushing the Tag cache and the plurality of data keep caches is explained in more detail below in conjunction with FIG. 9.

However, if the controller determines at step 810 that additional locations of the memory should be examined, at step 814, the controller determines a second physical location of the memory that may have a potential error based on the determined failure at the original physical location of the memory. At step 816, the controller identifies a data keep cache associated with the second physical location.

At step 818, the controller calculates data associated with the second physical location based on the XOR sum stored in the identified data keep cache that is associated with the second physical location of the memory. In one implementation, the controller calculates the data associated with the second physical location by beginning with the XOR sum and XORing the data of each physical location of the memory stored in the Tag cache that is also associated with the identified data keep other than the data that is determined to have a potential error.

At step 820, the controller may compare the calculated data associated with the second physical location to the actual data stored at the second physical location to determine whether the data that is stored at the second physical location has been disturbed. At step 822, the controller restores the data stored at the second physical location of the memory when the controller determines that the data stored at the second physical location of the memory has been disturbed.

It will be appreciated that the process may then loop to step 810 and that the controller will repeat the above-described steps until the controller determines that no additional physical locations of the memory should be examined. After the data recovery is complete, the controller flushes the Tag cache and the plurality of data keep caches at step 812.

As discussed above at step 710, step 726, and step 818, a controller may flush a Tag cache and a plurality of data keep caches after recovering data subsequent to detecting a failure or as part of a reset operation. In addition to these instances, a controller may also flush a Tag cache and a plurality of data keep caches when the controller erases a memory block and the controller determines that a physical location of the memory associated with the memory block is present in the Tag cache.

Figure 9:
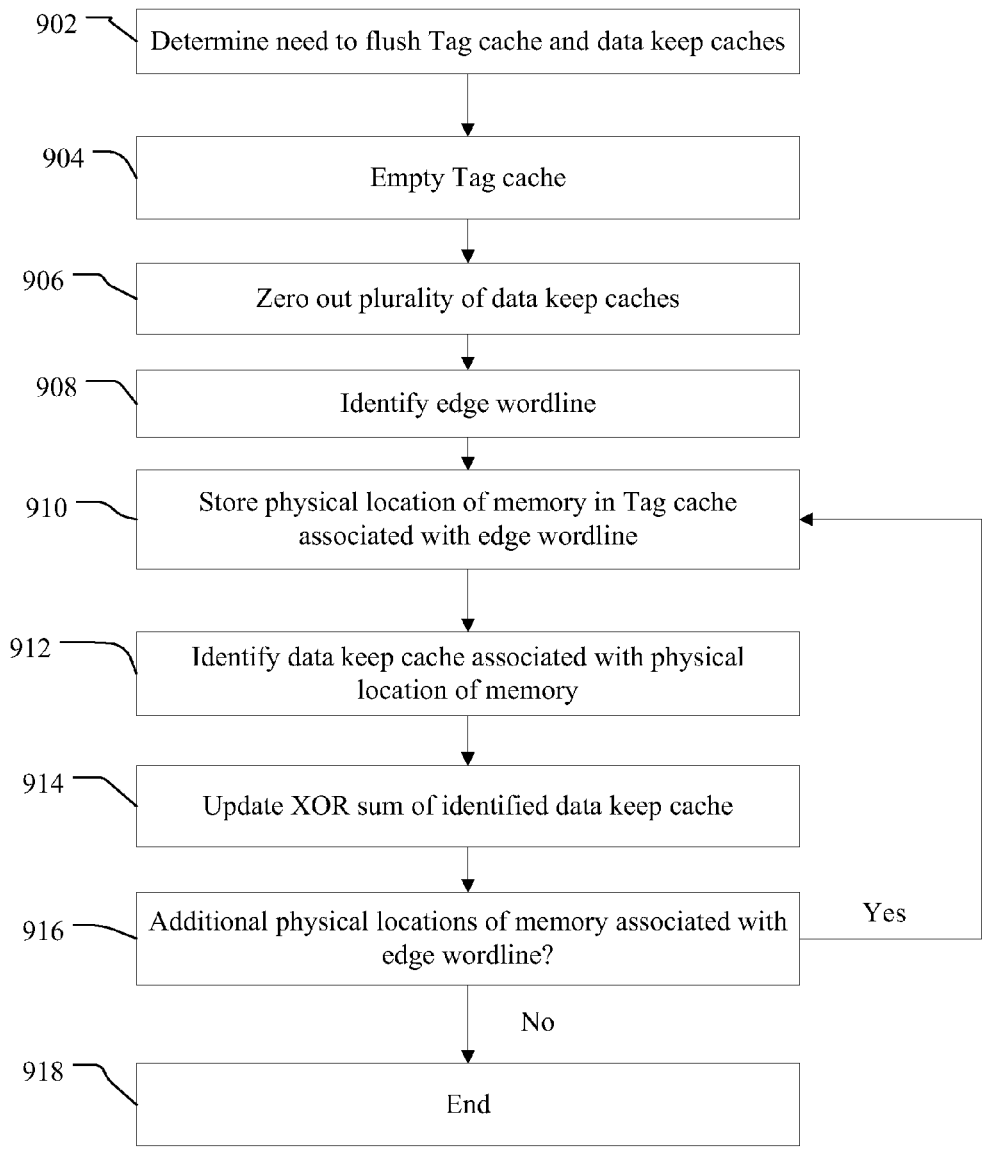
FIG. 9 is a flow chart of one method for performing a reset operation to flush a Tag cache and a plurality of data keep caches.

FIG. 9 is a flow chart of one method for flushing a Tag cache and a plurality of data keep caches. At step 902, the controller determines a need to flush the Tag cache and the plurality of data keep caches. As noted above, the controller may determine a need to flush the Tag cache and the plurality of data keep caches, for example, after completing data recovery, as part of a reset operation, or when a memory block is erased or compacted and the controller determines that a physical location of the memory associated with the memory block is stored in the Tag cache.

At step 904, the controller may flush the Tag cache by erasing all the values in the Tag cache, and at step 906, the controller may flush the plurality of data keep caches by resetting all the XOR sums stored in the data keep caches.

In some implementations, after flushing the Tag cache and the plurality of data keep caches, the controller may identify at step 908 an edge wordline associated with any data that is still vulnerable to errors. For example with respect to open blocks of memory, at step 908, for every open block, the controller identifies an edge wordline as a wordline of a memory that is associated with the last physical location of the memory that the controller has written data to.

It will be appreciated that data stored at a physical locations of the memory associated with the edge wordline may still be vulnerable to failures at the time of flushing the Tag cache and the plurality of data keep caches. It is for this reason that the controller stores physical locations of the memory associated with the edge wordline back into the Tag cache and updates the relevant XOR sums stored in the data keep caches as described below.

At step 910, the controller stores a physical location of the memory that is associated with the identified edge wordline in the Tag cache. At step 912, the controller identifies a data keep cache associated with the physical location of the memory stored in the Tag cache at step 910, and at step 914, the controller updates the XOR sum stored in the data keep cache based on the data stored at the physical location of the memory stored in the Tag cache at step 910.

At step 916, the controller determines whether there are additional physical locations of the memory associated with the edge wordline that may be vulnerable to failures that are not stored in the Tag cache. If the controller determines at step 916 that additional physical locations of the memory associated with the edge wordline exist that may be vulnerable to failures and are not stored in the Tag cache, the method loops to step 910 and the above-described process is repeated. However, if the controller determines at step 916 that the Tag cache includes all the physical locations of the memory associated with the edge wordline exist that may be vulnerable to failures, the process ends at step 918.

As discussed above in conjunction with FIG. 9, a controller may flush a Tag cache and a plurality of data keep caches when a memory block is erased or compacted and the controller determines that a physical location of memory associated with the memory block is stored in the Tag cache. In some implementations, a controller may associate a flag with each memory block that indicates whether one or more physical locations of memory of the memory block are present in a Tag cache. Before the controller erases a memory block, the controller checks the flag to determine whether or not the flag indicates that one or more physical locations of memory of the memory block are present in the Tag cache.

When the physical locations of memory of the memory block are not present in the Tag cache, the controller proceeds to delete the memory block. However, when one or more physical locations of memory of the memory block are present in the Tag cache, the controller proceeds to perform a verification operation, such as the verification operation described above in conjunction with FIG. 8, to verify the data at each physical location of memory stored in the data cache. It will be appreciated that this may result in the controller verifying data stored at physical locations of memory that are present in memory blocks other than the memory block being erased.

In some implementations the controller may perform the operations described above in conjunction with FIGS. 7-9 throughout a life of the memory system. However, in other implementations, the controller may disable one or more of the Tag cache and the plurality of data keep caches in order to increase performance of the memory system. Typically, the controller will disable one or more of the Tag cache and the plurality of data keep caches when a factor indicates to the controller that a probability of a new failure occurring in the memory is low.

For example, a controller may monitor a number of data writes to a memory as a whole or monitor a number of data writes to a specific physical location of a memory. When the number of monitored data writes exceeds a threshold, the controller may disable one or more of the Tag cache and the plurality of data keep caches.

FIGS. 1-9 illustrate systems and methods for performing defect detection and data recovery in a memory system. As explained above, a controller may utilize a system cache, such as a Tag cache, and a plurality of data keep caches to store information as the controller performs data write operations. The controller periodically performs verification operations and reset operations in order to detect corrupted data.

When an error is detected, the controller may reconstruct and restore data to the physical location of the memory associated with the memory. Additionally, the controller may test other physical locations of the memory for potential errors based on the physical location of the detected error. Because the memory device utilizes techniques that are able to detect defects in a memory and perform error correction at a system level, manufactures may refrain from performing harsh tests on the memory system that may reduce the overall yield of the memory.

It is intended that the foregoing detailed description be regarded as illustrative rather than limiting, and that it be understood that it is the following claims, including all equivalents, that are intended to define the spirit and scope of this invention.

The invention claimed is:

1. A method for performing data recovery in a memory system, the method comprising:
   in a controller of a memory system coupled to a host device:
      writing data to a physical location of a memory of the memory system;
      storing the physical location of the memory in a Flash Management Unit Tag cache ("Tag cache");
      identifying a data keep cache of a plurality of data keep caches that is associated with the physical location of the memory;
      updating an XOR sum stored in the identified data keep cache based on the data written to the physical location of the memory and the XOR sum that is stored in the identified data keep cache;
      storing the updated XOR sum in the identified data keep cache;
      determining whether to perform a verification operation based on a number of physical locations of memory stored in the Tag cache since a previous verification operation, wherein a determination is made to perform a verification operation when a number of physical locations stored in the Taq cache since a previous operation exceeds a first threshold;
      in response to a determination to perform the verification operation, verifying data stored at each physical location of memory that has been stored in the Tag cache since the previous verification operation;
      determining whether to perform a reset operation to flush the Tag cache and the plurality of data keep caches based on a number of physical locations stored in the Tag cache, wherein a determination is made to perform a reset operation when a number of physical locations stored in the Taq cache exceeds a second threshold; and
      in response to a determination to perform the reset operation, flushing the Tag cache and the plurality of data keep caches.

2. The method of claim 1, where the second threshold is greater than the first threshold.

3. The method of claim 1, wherein the second threshold is at least 150 times as large as the first threshold.

4. The method of claim 1, wherein verifying data stored at each physical location that has been stored in the Tag cache since the previous verification operation comprises:
   for each physical location that has been stored in the Tag cache since the previous verification operation:
      determining whether the data stored at the physical location is corrupted;
      in response to determining that the data stored at the physical location is corrupted:
         recalculating the data that should be stored at the physical location where the corruption occurred based on the XOR sum that is stored in the data keep cache associated with the physical location where the corruption occurred; and
         restoring the data.

5. The method of claim 4, wherein restoring the data comprises writing the restored data to the physical location where the corruption occurred.

6. The method of claim 4, wherein restoring the data comprises writing the restored data to a physical location other than the physical location where the corruption occurred.

7. A method for performing data recovery in a memory system, the method comprising:
   in a controller of a memory system coupled to a host device:
      writing data to a physical location of a memory of the memory system;
      storing the physical location of the memory in a Flash Management Unit Tag cache ("Tag cache");
      identifying a data keep cache of a plurality of data keep caches that is associated with the physical location of the memory;

updating an XOR sum stored in the identified data keep cache based on the data written to the physical location of the memory and the XOR sum that is stored in the identified data keep cache;

storing the updated XOR sum in the identified data keep cache;

determining whether to perform a verification operation based on a number of physical locations of memory stored in the Tag cache since a previous verification operation;

in response to a determination to perform the verification operation, verifying data stored at each physical location of memory that has been stored in the Tag cache since the previous verification operation;

determining whether to perform a reset operation to flush the Tag cache and the plurality of data keep caches based on a number of physical locations stored in the Tag cache; and in response to a determination to perform the reset operation, flushing the Tag cache and the plurality of data keep caches, wherein flushing the Tag cache and the plurality of data keep caches comprises:

determining that data stored at a physical location of memory that is stored within the Tag cache is vulnerable to failure;

after flushing the Tag cache and the plurality of data keep caches;

restoring the physical location of memory that is vulnerable to a failure in the Tag cache;

identifying a data keep cache that is associated with the physical location of memory that is vulnerable to a failure;

updating an XOR sum stored in the identified data keep cache that is associated with the physical location of memory that is vulnerable to a failure based on the data stored at the physical location of memory that is vulnerable to a failure; and storing the updated XOR sum in the identified data keep cache that is associated with the physical location of memory that is vulnerable to a failure.

8. A method for performing data recovery in a memory system, the method comprising:

in a controller of a memory system coupled to a host device:

writing data to a physical location of a memory of the memory system;

storing the physical location of the memory in a Flash Management Unit Tag cache ("Tag cache");

identifying a data keep cache of a plurality of data keep caches that is associated with the physical location of the memory;

updating an XOR sum stored in the identified data keep cache based on the data written to the physical location of the memory and the XOR sum that is stored in the identified data keep cache;

storing the updated XOR sum in the identified data keep cache;

determining whether to perform a verification operation based on a number of physical locations of memory stored in the Tag cache since a previous verification operation;

in response to a determination to perform the verification operation, verifying data stored at each physical location of memory that has been stored in the Tag cache since the previous verification operation;

determining whether to perform a reset operation to flush the Tag cache and the plurality of data keep caches based on a number of physical locations stored in the Tag cache; and in response to a determination to perform the reset operation, flushing the Tag cache and the plurality of data keep caches;

receiving a command to erase a first block of physical locations of memory;

determining whether one or more physical locations of memory within the first block is stored in the Tag cache;

in response to determining that no physical locations of memory within the first block is stored in the Tag cache, erasing the first block of physical locations of memory;

in response to determining that one or more physical locations of memory within the first block is stored within the Tag cache:

performing a verification operation on each physical location of memory within the Tag cache;

flushing the Tag cache and the plurality of data keep caches; and erasing the first block of physical locations.

9. The method of claim 8, wherein performing a verification operation on each physical location of memory with the Tag cache comprises:

performing a verification operation on at least one physical location of memory that is within a second block of physical locations.

10. A memory system comprising:

a non-volatile memory; and a processor in communication with the non-volatile memory and configured to perform data recovery in the memory system, the processor configured to:

write data to a physical location of the non-volatile memory;

store the physical location of the non-volatile memory in a Flash Management Unit Tag cache ("Tag cache");

identify a data keep cache of a plurality of data keep caches that is associated with the physical location of the non-volatile memory;

update an XOR sum stored in the identified data keep cache based on the data written to the physical location of the non-volatile memory and the XOR sum that is stored in the identified data keep cache;

store the updated XOR sum in the identified data keep cache;

determine whether to perform a verification operation based on a number of physical locations of the non-volatile memory stored in the Tag cache since a previous verification operation, wherein the processor is configured to determine to perform a verification operation when a number of physical locations of non-volatile memory stored in the Tag cache since a previous verification operation exceeds a first threshold;

in response to a determination to perform the verification operation, verify data stored at each physical location of the non-volatile memory that has been stored in the Tag cache since the previous verification operation;

determine whether to perform a reset operation to flush the Tag cache and the plurality of data keep caches based on a number of physical locations of the non-volatile memory stored in the Tag cache, wherein the processor is configured to determine to perform a reset operation when a number of physical locations of non-volatile memory stored in the Tag cache exceeds a second threshold; and in response to a determination to perform the reset operation, flush the Tag cache and the plurality of data keep caches.

11. The memory system of claim 10, wherein the second threshold is at least 150 times as large as the first threshold.

12. The memory system of claim 10, wherein to verify data stored at each physical location of the non-volatile memory that has been stored in the Tag cache since the previous verification operation comprises, the processor is configured to:

for each physical location of the non-volatile memory that has been stored in the Tag cache since the previous verification operation:
determine whether the data stored at the physical location of the non-volatile memory is corrupted;
in response to a determination that the data stored at the physical location of the non-volatile memory is corrupted:
recalculate the data that should be stored at the physical location of the non-volatile memory where the corruption occurred based on the XOR sum that is stored in the data keep cache associated with the physical location of the non-volatile memory where the corruption occurred; and
restore the data.

13. A memory system comprising:
a non-volatile memory; and
a processor in communication with the non-volatile memory and configured to perform data recovery in the memory system, the processor configured to:
write data to a physical location of the non-volatile memory;
store the physical location of the non-volatile memory in a Flash Management Unit Tag cache ("Tag cache");
identify a data keep cache of a plurality of data keep caches that is associated with the physical location of the non-volatile memory;
update an XOR sum stored in the identified data keep cache based on the data written to the physical location of the non-volatile memory and the XOR sum that is stored in the identified data keep cache;
store the updated XOR sum in the identified data keep cache;
determine whether to perform a verification operation based on a number of physical locations of the non-volatile memory stored in the Tag cache since a previous verification operation;
in response to a determination to perform the verification operation, verify data stored at each physical location of the non-volatile memory that has been stored in the Tag cache since the previous verification operation;
determine whether to perform a reset operation to flush the Tag cache and the plurality of data keep caches based on a number of physical locations of the non-volatile memory stored in the Tag cache; and
in response to a determination to perform the reset operation, flush the Tag cache and the plurality of data keep caches, wherein to flush the tag cache, the processor is configured to:
determine that data stored at a physical location of the non-volatile memory that is stored within the Tag cache is vulnerable to failure;
after flushing the Tag cache and the plurality of data keep caches;
restore the physical location of the non-volatile memory that is vulnerable to a failure in the Tag cache;
identify a data keep cache that is associated with the physical location of the non-volatile memory that is vulnerable to a failure;
update an XOR sum stored in the identified data keep cache that is associated with the physical location of the non-volatile memory that is vulnerable to a failure based on the data stored at the physical location of the non-volatile memory that is vulnerable to a failure; and
store the updated XOR sum in the identified data keep cache that is associated with the physical location of the non-volatile memory that is vulnerable to a failure.

14. A memory system comprising:
a non-volatile memory; and
a processor in communication with the non-volatile memory and configured to perform data recovery in the memory system, the processor configured to:
write data to a physical location of the non-volatile memory;
store the physical location of the non-volatile memory in a Flash Management Unit Tag cache ("Tag cache");
identify a data keep cache of a plurality of data keep caches that is associated with the physical location of the non-volatile memory;
update an XOR sum stored in the identified data keep cache based on the data written to the physical location of the non-volatile memory and the XOR sum that is stored in the identified data keep cache;
store the updated XOR sum in the identified data keep cache;
determine whether to perform a verification operation based on a number of physical locations of the non-volatile memory stored in the Tag cache since a previous verification operation;
in response to a determination to perform the verification operation, verify data stored at each physical location of the non-volatile memory that has been stored in the Tag cache since the previous verification operation;
determine whether to perform a reset operation to flush the Tag cache and the plurality of data keep caches based on a number of physical locations of the non-volatile memory stored in the Tag cache; and
in response to a determination to perform the reset operation, flush the Tag cache and the plurality of data keep caches;
receive a command to erase a first block of physical locations of the non-volatile memory;
determine whether one or more physical locations of the non-volatile memory within the first block is stored in the Tag cache;
in response to a determination that no physical locations of the non-volatile memory within the first block is stored in the Tag cache, erase the first block of physical locations of the non-volatile memory;
in response to a determination that one or more physical locations of the non-volatile memory within the first block is stored within the Tag cache:
perform a verification operation on each physical location of the non-volatile memory within the Tag cache;
flush the Tag cache and the plurality of data keep caches; and
erase the first block of physical locations.

15. The memory system of claim 14, wherein to perform a verification operation on each physical location with the Tag cache, the processor is configured to:

perform a verification operation on at least one physical location that is within a second block of physical locations.

* * * * *